United States Patent [19]

Uehara et al.

[11] Patent Number: 5,278,471
[45] Date of Patent: Jan. 11, 1994

[54] PIEZOELECTRIC CERAMIC TRANSFORMER

[75] Inventors: Kaneo Uehara; Takeshi Inoue; Akio Iwamoto; Osamu Ohnishi; Yasuhiro Sasaki, all of Tokyo, Japan

[73] Assignee: NEC Corporation, Tokyo, Japan

[21] Appl. No.: 940,024

[22] Filed: Sep. 3, 1992

[30] Foreign Application Priority Data

Sep. 10, 1991 [JP] Japan .................. 3-229995

[51] Int. Cl.⁵ .......................................... H01L 41/08
[52] U.S. Cl. .................................. 310/328; 310/358; 310/366; 310/369
[58] Field of Search ............... 310/328, 311, 330–332, 366, 367, 369, 358, 359, 316, 317, 319, 323

[56] References Cited

U.S. PATENT DOCUMENTS

| | | | |
|---|---|---|---|
| 2,974,296 | 3/1961 | Rosen | 310/359 |
| 3,271,622 | 9/1966 | Malagodi et al. | 310/316 |
| 4,564,782 | 1/1986 | Ogawa | 310/359 |
| 4,742,264 | 5/1988 | Ogawa | 310/332 |

*Primary Examiner*—Mark O. Budd
*Attorney, Agent, or Firm*—Laff, Whitesel, Conte & Saret

[57] ABSTRACT

A piezoelectric ceramic transformer includes a high impedance portion having internal electrode layers which are opposite each other in a thickness direction in a radial central portion of a piezoelectric ceramic disc; an annular insulating portion disposed externally of the high impedance portion and having no electrode; and a low impedance portion disposed externally of the annular insulating portion and having annular internal electrode layers which are opposite each other in a thickness direction, the internal electrode layers of the high impedance portion being exposed on the side end face of the piezoelectric ceramic disc at respective ends thereof without being in contact with the annular internal electrode layer of the low impedance portion and being alternately connected on the side end face with external electrodes, each of which is connected with an electric terminal, and the internal electrode layers of the low impedance portion being exposed on the side end face of the piezoelectric ceramic disc at respective ends thereof and being alternately connected on the side end face with external electrodes, each of which is connected with an electric terminal. The transformer is operable in a high frequency band and can be used for an onboard power supply.

16 Claims, 6 Drawing Sheets

FIG.8

PIEZOELECTRIC CERAMIC TRANSFORMER

BACKGROUND OF THE INVENTION

1. Field of the Invention

The present invention relates to a piezoelectric ceramic transformer, which is operable in a high frequency band and more particularly to a piezoelectric ceramic transformer for an onboard power supply whose smaller size and lower noize are demanded.

2. Description of the Prior Art

An electromagnetic transformer has recently been used as a switching power source to make a power circuit for electronic equipment more compact and an increase in switching frequency has been demanded to provide a more compact switching power source. However, as the switching frequency is increased, the power loss due to hysteresis loss and eddy current loss of the magnetic material used in the electromagnetic transformer and the loss due to the skin effect of the conductor are sharply increased, resulting in a considerably low efficiency of the transformer. Accordingly, the upper limit of the practical frequency of the electromagnetic transformer was at most 500 kHz.

In contrast to the general electromagnetic transformer, a multilayer piezoelectric ceramic transformer has been used in a resonant mode and had a number of advantages as follows:

(1) The size of the transformer can be made smaller since the energy density at the same frequency is higher.

(2) The transformer can be made nonflammable.

(3) No noise due to electromagnetic induction is generated.

Figure 1:
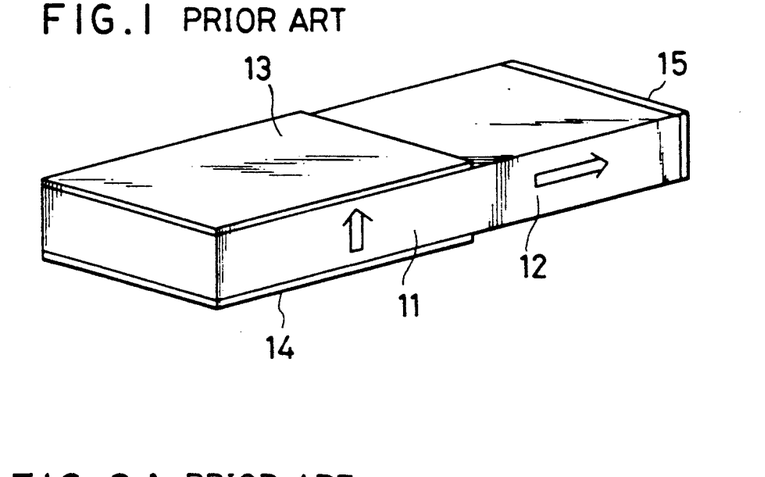
FIG. 1 is a perspective view showing a prior art Rosen type piezoelectric transformer.

The structure of a Rosen type piezoelectric transformer which is a typical prior art piezoelectric transformer will be described with reference to FIG. 1 as follows. In a piezoelectric ceramic plate for outputting a voltage which is provided with electrodes on surfaces thereof, a reference numeral 11 denotes a low impedance drive portion of the piezoelectric transformer, which is provided with electrodes 13 and 14 on the upper and lower surfaces thereof, respectively. The drive portion 11 is polarized in a thickness direction as shown by an arrow in the drawing. A reference numeral 12 denotes a high impedance generating portion which is provided with an electrode 15 on the side end face thereof and the generating portion 12 is polarized in a longitudinal direction of the piezoelectric ceramic plate as represented by an arrow in the drawing. For example, in the case that it is desired to output a high voltage by inputting a low voltage, the piezoelectric transformer operates as follows. When a drive voltage is applied across the electrodes 13 and 14, length extensional vibration is excited by a piezoelectric unstiffened effect with an electromechanical coupling factor $k_{31}$ and in the generating portion 12, the high voltage can be outputted from the electrode 15 due to piezoelectric stiffened effect at an electromechanical coupling factor $k_{33}$.

On the other hand, in the case that it is desired to output a low voltage by inputting a high voltage, it is apparent that it will be sufficient to use the high impedance portion and the low impedance portion as input and output sides, respectively.

Figure 2A:
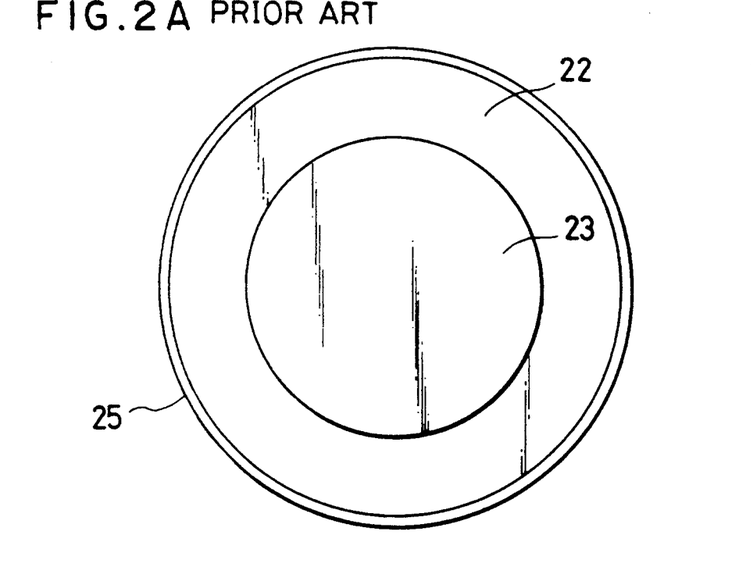
FIGS. 2A and 2B are plan and sectional views showing a prior art piezoelectric transformer using a piezoelectric ceramic disc, respectively.
Figure 2B:
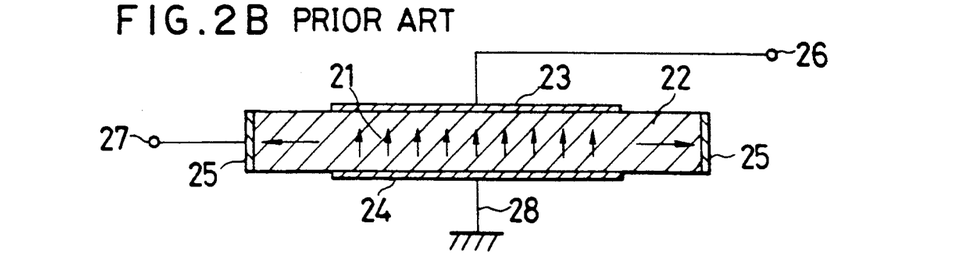

Besides such a Rosen type piezoelectric transformer, the other piezoelectric transformer as shown in FIGS. 2A and 2B using a radial extensional vibration mode of a disc has been known in the art. The operation principle of the piezoelectric transformer as shown in FIGS. 2A and 2B is identical with that of the Rosen type transformer. In the drawings, arrows denote the polarization direction; 21 denotes a low impedance portion; 22 denotes a high impedance portion; 23, 24 and 25 denote electrodes; 26 and 27 denote electrical terminals; and 28 denotes a ground. In such a piezoelectric transformer, the high impedance portion 22 of the piezoelectric stiffened effect is polarized in a length direction or a radial direction as shown by arrows in FIG. 2B. A d.c. voltage is necessary to perform a polarization treatment as is well known. For example, in case of PZT family piezoelectric ceramics, the intensity of the necessary polarization field is about 4 kV/mm. As the distance between the electrodes in the high impedance portion becomes longer, the polarization voltage increases. Accordingly, the piezoelectric transformer may be damaged due to the high polarization voltage when the polarization treatment is performed.

The operation frequency of the prior piezoelectric transformers described above remains at most 200 kHz since it uses length longitudinal resonation or fundamental radial extensional resonation.

As mentioned in the description of the prior art, the applicable frequency of the prior art piezoelectric transformer is limited to low frequencies of not more than 200 kHz. Since the prior art piezoelectric transformer can be used only in a low frequency band, a higher current cannot flow through the transformer. Accordingly, it is not suitable for a transformer for a power source. Further, it is necessary to apply a d.c. high voltage upon the transformer since polarization treatment is performed in a length or radial direction. Therefore, the piezoelectric transformer may be damaged on this polarization treatment. The Rosen type piezoelectric transformer is disadvantageous in that it has a low exciting efficiency since it can not help relying upon the coupling factor $k_{31}$ of the piezoelectric unstiffened effect which is remarkably lower than the coupling factor $k_{33}$ of the piezoelectric stiffened effect.

SUMMARY OF THE INVENTION

It is therefore an object of the present invention to provide a compact piezoelectric transformer for a power supply which is low in loss and is capable of sufficiently operating in a high frequency band of at least 500 kHz.

According to a first embodiment of the present invention, there is provided a piezoelectric ceramic transformer comprising a high impedance portion having internal electrode layers which are opposite each other in a thickness direction in a radial central portion of a piezoelectric ceramic disc; an annular insulating portion disposed externally of the high impedance portion and having no electrode; and a low impedance portion disposed externally of the annular insulating portion and having annular internal electrode layers which are opposite each other in a thickness direction. the internal electrode layers of the high impedance portion being exposed on the side end face of the piezoelectric ceramic disc at respective ends thereof without being in contact with the annular internal electrode layers of the low impedance portion and being alternately connected on the side end face with external electrodes, each of which is connected with an electric terminal, and the internal electrode layers of the low impedance portion being exposed on the side end face of the piezoelectric ceramic disc at respective ends thereof and being alternately connected on the side end face with external electrodes, each of which is connected with an electric terminal. According to a second embodiment of the present invention, in the piezoelectric ceramic transformer as shown in the first embodiment, the internal electrode layers of the high impedance portion which are exposed on the side end face of the piezoelectric ceramic disc at respective ends thereof are connected on the side end face with the external electrodes which are formed extending from the side end face of the piezoelectric ceramic disc to a radial central portion of the upper and lower surfaces opposed in a thickness direction of the piezoelectric ceramic disc and each of the external electrodes is connected with each of electric terminals which are formed on the central portions on the upper and lower surfaces of the disc, and further the internal electrode layers of the low impedance portion which are exposed on the side end face of the piezoelectric ceramic disc at respective ends thereof are connected via external electrodes at the respective ends thereof with electric terminals which are formed in positions corresponding to the centers of the width of the internal electrode layers of the low impedance portion in a radial direction on the upper and lower surfaces of the piezoelectric ceramic disc opposed in a thickness direction.

DESCRIPTION OF PREFERRED EMBODIMENTS

The piezoelectric transformer of the present invention has a structure in which the internal electrode layers are disposed in so proper position that the exciting efficiency is high and are opposed each other in a thickness direction, whereby the third radial extensional vibration mode can be positively utilized. The internal electrode layers are exposed on the side end face of a piezoelectric ceramic disc at respective ends thereof and are alternately connected with each other via external electrodes on the side end face of the disc. In case where internal electrode layers of the high impedance portion are disposed on a level with those of the low impedance portion, in order to expose the internal electrode layers of the high impedance portion on the side end face of the ceramic disc, the internal electrode layers of the low impedance portion are notched and electrically conductive materials are disposed in a ceramic portion having no electrode, whereby the internal electrode layers of the high impedance portion can be led out on the side end face of the disc. In this case, the width of the notches in the internal electrode layers will give an influence to the power source efficiency since these notches make the electric field in the layers inactive. However, various experiments show that the width of the notches in the internal electrode layers causes no problems in power source efficiency if the notch width is within 10% of the diameter of the piezoelectric ceramic transformer. Since the vibration displacement distribution of the piezoelectric ceramic transformer in the third radial extensional vibration mode maximizes at the side end face of the piezoelectric ceramic transformer, it is preferable to take out electrical terminals from the side end face in a point having an area as small as possible or from a position where the vibration displacement distribution of the piezoelectric ceramic transformer in a third radial extensional vibration mode minimizes, that is, the center of the internal electrode layers in a radial direction and the center of the annular internal electrode layers in a width direction. Such an arrangement of the electrical terminals can achieve a piezoelectric ceramic transformer having a high vibration efficiency without causing any interference to the vibration stress distribution by taking out the electrical terminals from the internal electrode layers.

The present piezoelectric transformer can be fabricated by a multilayer ceramic technology such as a tape casting method. The layer spacing can be made thinner to about 10 $\mu$m in the low impedance portion if the transformer is fabricated by this method.

Next, principle of operation of a piezoelectric transformer of the present invention will be described with reference to the drawings.

Figure 3A:
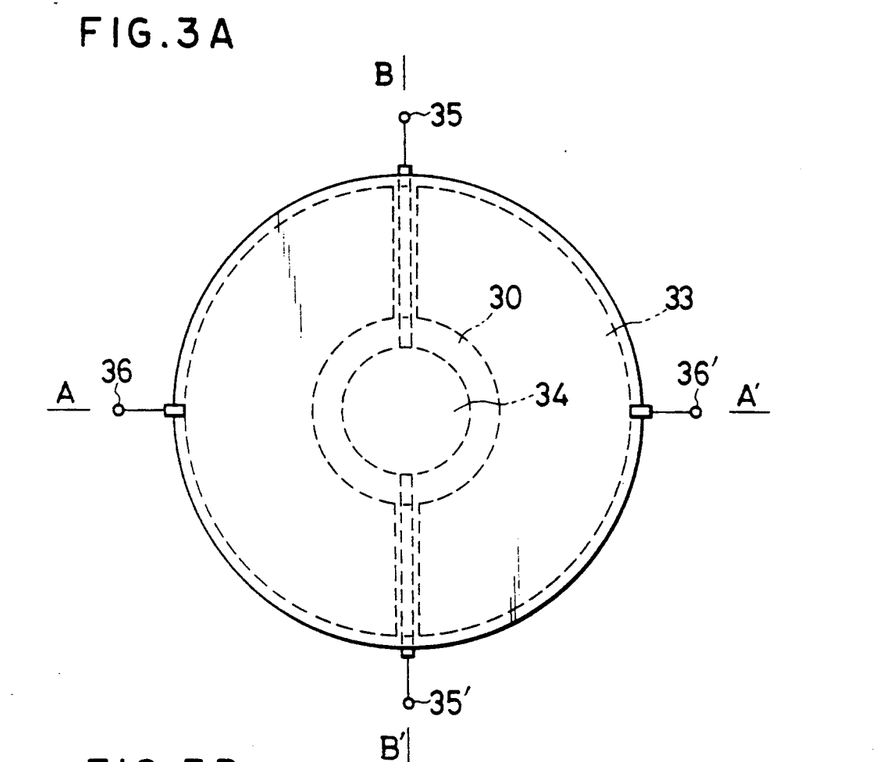
FIG. 3A is a plan view showing a piezoelectric ceramic transformer of the present invention.
Figure 3B:
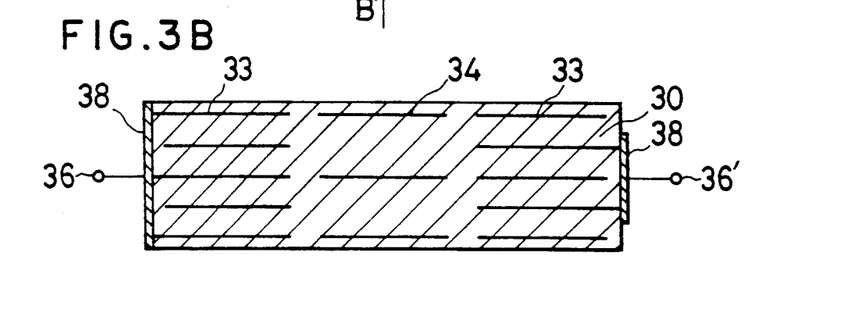
FIGS. 3B and 3C are sectional views taken along the lines A—A' and B—B' in FIG. 3A, respectively.
Figure 3C:
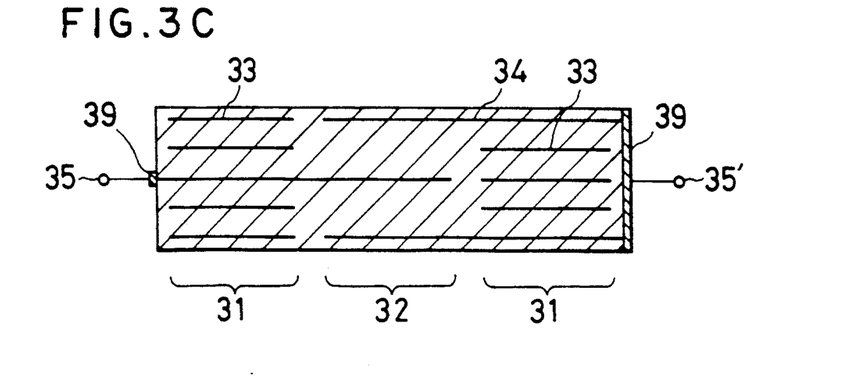
Figure 4A:
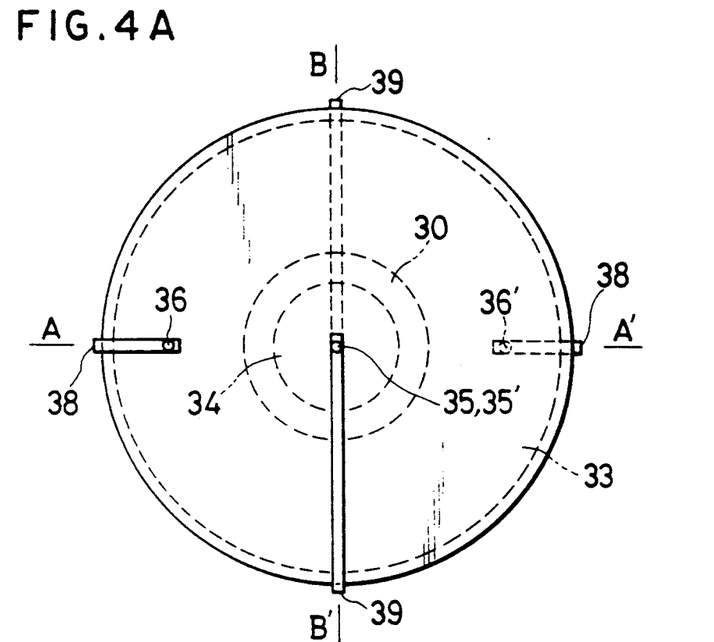
FIG. 4A is a plan view showing another piezoelectric transformer of the present invention.

FIGS. 3A and 4A are plan views showing piezoelectric ceramic transformers of the present invention and FIGS. 3B, 3C, 4B and 4C are sectional views of the piezoelectric transformers. In FIGS. 3A to 3C, for example, if it is desired to step down an input voltage, the transformer comprises input terminals 35 and 35', output terminals 36 and 36', and portions 31 and 32 which function as a generator and a drive unit, respectively. When an alternating voltage is applied across the input terminals 35 and 35', the piezoelectric transformer is strongly excited in a third radial extensional vibration mode, and at the same time an efficiently stepped-down alternating voltage can be taken out from the output terminals 36 and 36'. The resonant frequency in the third radial extensional vibration mode is about 2.7 times as high as the resonant frequency of the fundamental radial extensional vibration.

The displacement of vibration U(r) in a position remote from a central axis by a distance r is expressed as follows:

$$U(r) \propto J_1(z)$$

wherein $J_1(z)$ represents a first kind, 1st order Bessel function, $z = 2\pi f_r r / v$, v represents the sound velocity (phase velocity) of the piezoelectric ceramic disc with respect to radial extensional vibration and $f_r$ represents the resonant frequency. The vibration displacement distribution in a radial direction can be determined from this relationship.

The distribution of stress T(r) is substantially represented with U(r) which is differentiated with respect to r, i.e. is expressed as follows:

$$T(r) \propto J_0(z)$$

wherein $J_0(z)$ is a first kind, 0 order Bessel function.

In the piezoelectric ceramic transformer according to the present invention, the central portion of each of the drive and generator electrodes corresponds to a portion where the magnitude (absolute value) of the vibration stress is maximized to achieve efficient drive and power generation.

A desired transformation ratio of the present piezoelectric ceramic transformer can be readily obtained by changing input and output electrostatic capacitances. Specifically, it is possible to achieve a desired transformation ratio by changing the number of layers in the input and output sides with each other. This is more effective than a method to achieve a desired transformation ratio by changing the diameter of a circular electrode in the input side or the width of an annular electrode in the output side, since if the number of layers is increased n times, the electrostatic capacitance becomes $n^2$ times and thus this method can easily and largely change the transformation ratio. The electromechanical coupling factor $k_p$ of the radial expanding vibration, which gives criteria for judgment on electromechanical conversion efficiency in case where the present piezoelectric ceramic transformer having such an electrode structure is excited in the third radial extensional vibration mode, is at least 0.5 in case of PZT family piezoelectric ceramic transformer. This value is not less than double of the electromechanical coupling factor $k_{31}$ of the longitudinal vibration of a plate or a bar of the piezoelectric unstiffened effect. Accordingly, although the value $k_p$ is a coupling factor of the piezoelectric unstiffened effect, it is about equal to or higher than the coupling factor $k_t$ of the thickness extensional vibration of the piezoelectric stiffened effect. In other words, a piezoelectric transformer having a very high energy conversion efficiency can be provided by properly arranging electrodes due to a fact that $k_p$ is used.

The piezoelectric transformer of the present invention has advantages that internal electrode layers are hardly separated or delaminated even on high power driving since the direction to which a stress caused by vibration is applied is in parallel with the surfaces of electrode layers and that the mechanical quality factor (Qm value) which is peculiar to the PZT family piezoelectric ceramics can be maintained in a transformed state since no stress is concentrated upon the electrode layers.

Next, embodiments of piezoelectric transformers of the present invention which operate in a third radial extensional vibration mode will be described in more detail with reference to FIGS. 3A to 3C and 4A to 4C.

In a first embodiment as shown in FIGS. 3A to 3C, a piezoelectric ceramic transformer comprises a high impedance portion 32 having three circular internal electrode layers 34 which are opposite each other in a thickness direction in a radial central portion of a piezoelectric ceramic disc, an annular insulating portion disposed externally of the high impedance portion 32, and a low impedance portion 31 disposed externally of the annular insulating portion and having five annular internal electrode layers 33 which are opposite each other in a thickness direction. The internal electrode layers 34 in the high impedance portion 32 are exposed on the side end face of the disc at respective ends thereof and are connected thereon to electric terminals 35 and 35' through external electrodes 39. Also the annular internal electrode layers 33 in the low impedance portion 31 are exposed on the side end face of the disc at respective ends thereof and are connected thereon to electric terminals 36 and 36' through external electrodes 38.

Figure 4B:
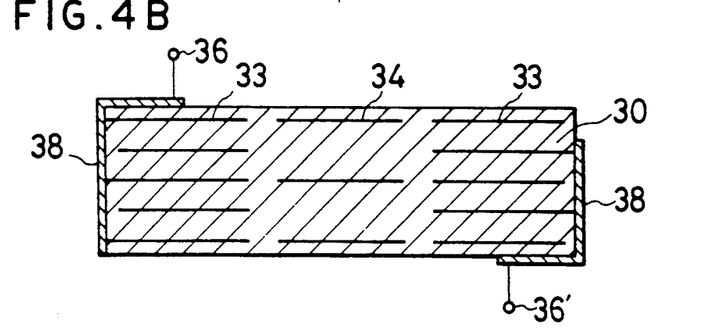
FIGS. 4B and 4C are sectional views taken along the lines A—A' and B—B' in FIG. 4A, respectively.
Figure 4C:
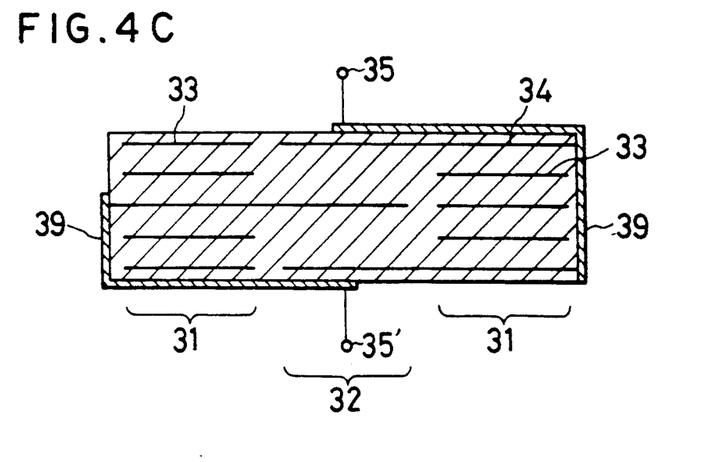

In a second embodiment as shown in FIGS. 4A to 4C, a piezoelectric ceramic transformer is the same as that of the first embodiment mentioned above, except that external electrodes 39 for three circular internal electrode layers 34 in high impedance portion 32 are formed extending from the side end face of a piezoelectric ceramic disc to a radial central portion of the upper and lower surfaces opposed in a thickness direction of the disc and are connected to electrical terminals 35 and 35' which are formed on the central portions of the upper and lower surfaces of the disc, respectively, and external electrodes 38 for five annular internal electrode layers 33 in low impedance portion 31 are formed extending from the side end faces of the disc to the centers of the width of the annular internal electrode layers 33 in a radial direction on the upper and lower surfaces of the disc opposed in a thickness direction and are connected to electrical terminals 36 and 36' which are formed in positions corresponding to the centers of the width of the annular internal electrode layers 33.

The piezoelectric transformers of the present invention as mentioned above are fabricated as follows.

Figure 5:
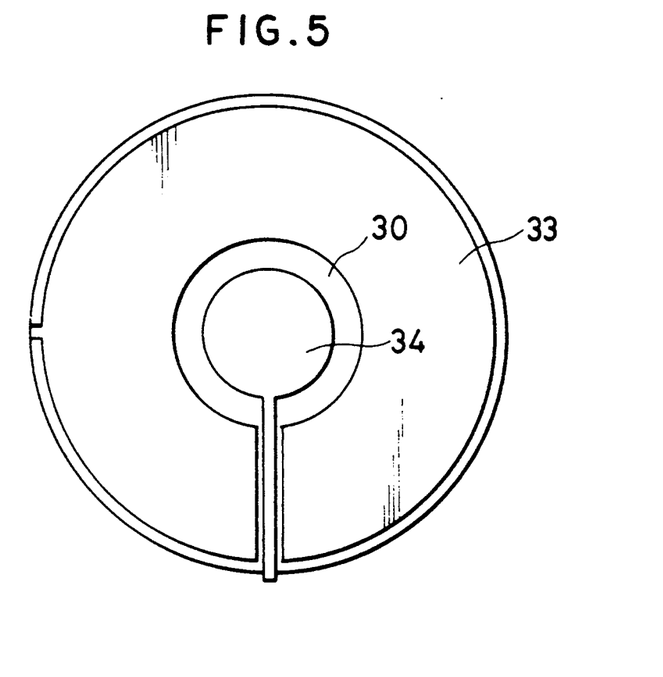
FIG. 5 is a plan view showing a pattern of internal electrodes printed on a green sheet.
Figure 6:
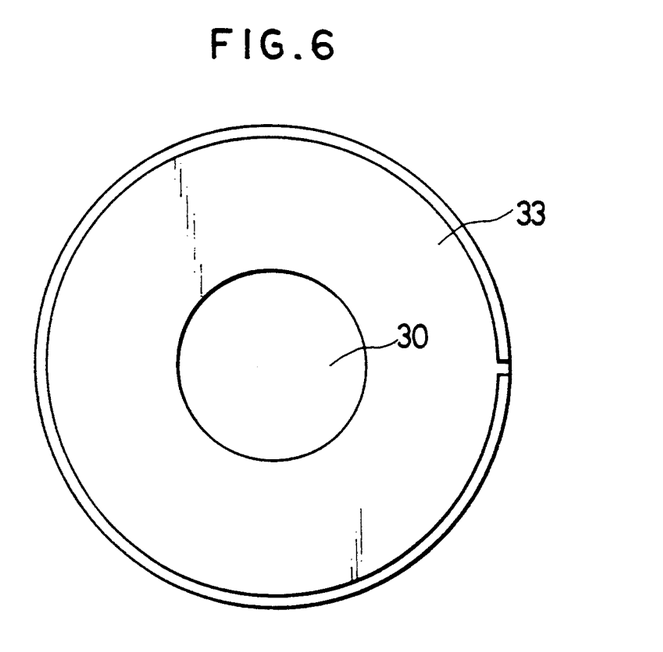
FIG. 6 is a plan view showing another pattern of an internal electrode printed on a green sheet.

First, PZT family piezoelectric ceramics powders (manufactured by K. K. Tohkin K. K. trade name NEPEC −61) was dispersed in a solvent with an organic binder to form a slurry. A green sheet about 70 um thick was manufactured from this slurry by a tape casting method using a doctor blade. A Pt paste including Pt which forms an internal electrode layer and electrical conductors, a binder and an organic solvent was printed upon the green sheet by a screen printing method. Pd and Ag-Pd may be used in place of Pt. FIGS. 5 and 6 show plan views of various patterns which have been printed on the green sheets. In FIG. 5, the notch of an annular internal electrode layer 33 was 0.3 mm wide and a conductor extending from a circular internal electrode layer 34 to the side edge of the piezoelectric ceramics disc was 0.1 mm wide.

Figure 7:
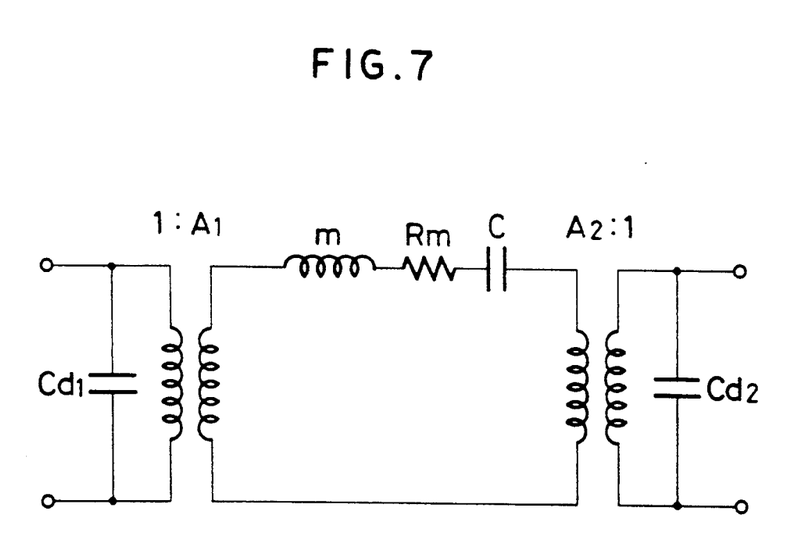
FIG. 7 is a lumped constant equivalent circuit diagram of the piezoelectric transformer of the present invention.

Thereafter, the printed green sheet was punched and cut into a prescribed shape or into a size suitable for a mold of a thermal press machine by means of a punching machine. After the cut green sheets were stacked in accordance with a given combination, they were thermally bonded to each other by the thermal press machine to form an integral green multilayers. The green multilayer was subjected to a thermal treatment in air at 600° C. for removing the binder therefrom. Then, the multilayer was fired at 1200° C. for 2 hours, and it was cut into a given size to form a piezoelectric ceramic transformer element. The upper and lower surfaces of the piezoelectric ceramic transformer were polished so that both surfaces are planar and in parallel with each other as shown in FIGS. 3B, 3C, 4B and 4C illustrating the sections of the multilayer products. External electrodes 38 and 39 were baked to the transformer and electrical terminals 36, 36' and 35, 35' were connected with the external electrodes 38 and 39, respectively. The transformer was subjected to a polarization treatment by applying a d.c. voltage of 4 kV/mm across the electrical terminals 35 and 35', and the electrical terminals 36 an 36'. Experimentally fabricated piezoelectric transformer had an outer diameter of 9.6 mm and a thickness of 1.5 mm. A low impedance side portion 31 of the piezoelectric transformer comprises four piezoelectric ceramics layers 30. The width of an annular internal electrode layer 33 was 3 mm and the diameter of a circular internal electrode layer 34 disposed centrally of the disc was 3.5 mm. Adjacent piezoelectric ceramic layers were alternately polarised along opposite directions as mentioned above. The lumped constant approximate equivalent circuit of the present piezoelectric transformer can be shown in FIG. 7. In FIG. 7, $C_{d1}$ and $C_{d2}$ denote clamped capacitances in input and output sides, respectively; $A_1$ and $A_2$ denote force factor; m, C and Rm denote equivalent mass, equivalent compliance and equivalent mechanical resistance in the third radical extensional mode, respectively. The present piezoelectric ceramic transformer was designed based upon a equivalent circuit shown in FIG. 7.

Figure 8:
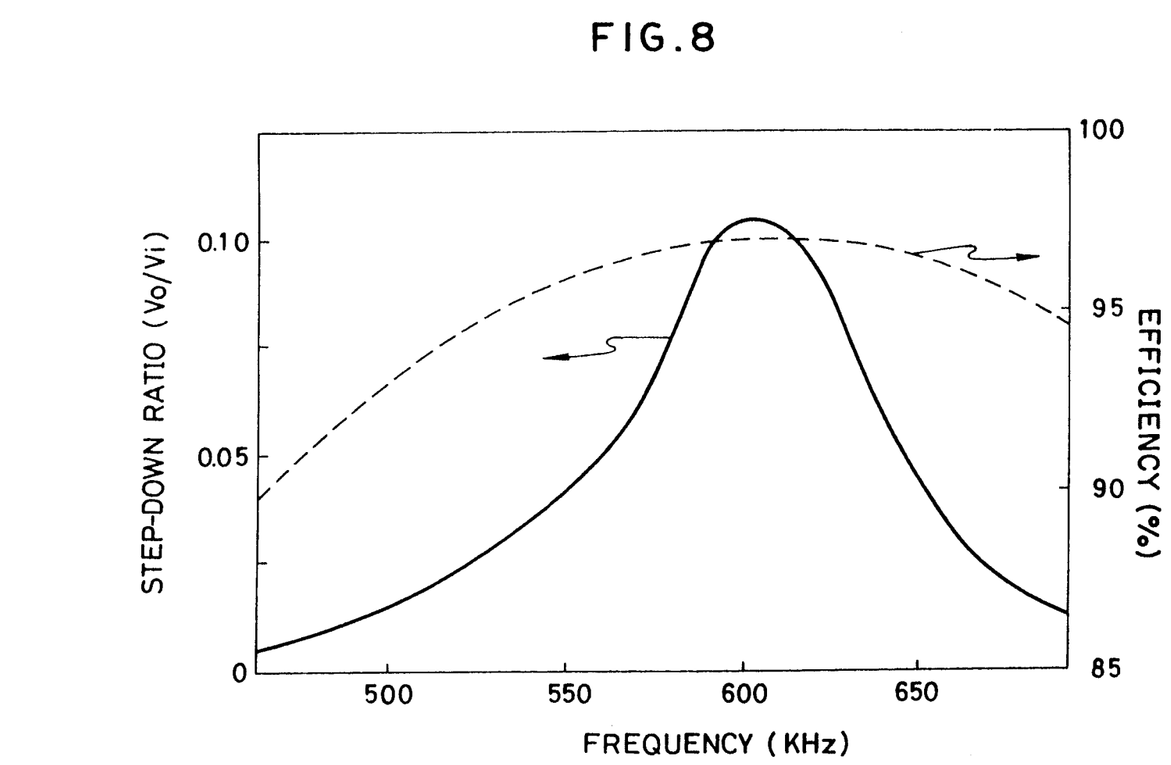
FIG. 8 is a graph showing the characteristics of the piezoelectric transformer of the present invention.

The experimentally fabricated piezoelectric ceramics transformer had a resonant frequency of 602 kHz, a mechanical quality factor Q of 830, a maximum energy transmission efficiency of 97% and a stable supply power of 4.5 W. Actually measured values of step-down ratio $V_o/V_i$ ($V_i$ and $V_o$ denote input and output voltages, respectively) and the efficiency % to the frequency of the obtained piezoelectric transformer are shown in FIG. 8. It can be seen from FIG. 8 that the experimentally fabricated piezoelectric transformer achieves a step-down function and high energy conversion efficiency.

It is a matter of course that the present piezoelectric transformer can be used as a step-up type transformer if the input and output terminals are taken out from low and high impedance portions, respectively.

As mentioned above, the piezoelectric ceramic transformer according to the present invention can be used in a frequency band higher than 500 kHz and has advantages over prior art piezoelectric ceramic transformers in that it is compact in size and efficient, and thus has a high industrial worth.

What is claimed is:

1. A piezoelectric ceramic transformer comprising a high impedance portion having internal electrode layers which are opposite each other in a thickness direction in a radial central portion of a piezoelectric ceramic disc; an annular insulating portion disposed externally of said high impedance portion and having no electrode; and a low impedance portion disposed externally of said annular insulating portion and having annular internal electrode layers which are opposite each other in a thickness direction, said internal electrode layers of the high impedance portion being exposed on the side end face of said piezoelectric ceramic disc at respective ends thereof without being in contact with said annular internal electrode layers of the low impedance portion and being alternately connected on the side end face with external electrodes, each of which is connected with an electric terminal, and said annular internal electrodes layers of the low impedance portion being exposed on the side end face of said piezoelectric ceramic disc at respective ends thereof and being alternately connected on the side end face with external electrodes, each of which is connected with an electric terminal.

2. The piezoelectric ceramic transformer as defined in claim 1 in which, when said internal electrode layers of the high impedance portion are disposed on a level with those of the low impedance portion, said internal electrode layers of the high impedance portion are led out on the side end face of the ceramic disc by notching said internal electrode layers of the low impedance portion and disposing an electrically conductive material in a ceramic portion having no electrodes.

3. The piezoelectric ceramic transformer as defined in claim 2 in which the width of notches in said internal electrode layers of the low impedance portion is within 10% of the diameter of the piezoelectric ceramic transformer.

4. The piezoelectric ceramic transformer as defined in claim 1 in which said transformer is a step-down type transformer.

5. The piezoelectric ceramic transformer as defined in claim 1 in which said transformer is a step-up type transformer.

6. The piezoelectric ceramic transformer as defined in claim 1 in which said transformer is used in a high frequency band not lower than 500 kHz.

7. The piezoelectric ceramic transformer as defined in claim 1 in which said transformer operates in a third radial extensional vibration mode.

8. The piezoelectric ceramic transformer as defined in claim 1 in which said internal electrode layers of the high impedance portion are composed of three Pt layers and said internal electrode layers of the low impedance portion are composed of five Pt layers.

9. A piezoelectric ceramic transformer comprising a high impedance portion having internal electrode layers which are opposite each other in a thickness direction in a radial central portion of a piezoelectric ceramic disc; an annular insulating portion disposed externally of said high impedance portion and having no electrode; and a low impedance portion disposed externally of said annular insulating portion and having annular internal electrode layers which are opposite each other in a thickness direction, said internal electrode layers of the high impedance portion which are exposed on the side end face of the piezoelectric ceramic disc at respective ends thereof are connected on the side end face with the external electrodes which are formed extending from the side end face of said piezoelectric ceramic disc to a radial central portion of the upper and lower surfaces opposed in a thickness direction of said piezoelectric ceramic disc and each of said external electrodes is connected with each of electric terminals which are formed on said central portions of the upper and lower surfaces of said disc, and further said internal electrodes layers of the low impedance portion which are exposed on the side end face of said piezoelectric ceramic disc at respective ends thereof are connected via external electrodes at said respective ends thereof with electric terminals which are formed in positions corresponding to the centers of the width of said internal electrode layers of said low impedance portion in a radial direction on the upper and lower surfaces of said piezoelectric ceramic disc opposed in a thickness direction.

10. The piezoelectric ceramic transformer as defined in claim 9 in which, when said internal electrode layers of the high impedance portion are disposed on a level with those of the low impedance portion, said internal electrode layers of the high impedance portion are led out on the side end face of the ceramic disc by notching said internal electrode layers of the low impedance portion and disposing an electrically conductive material in a ceramic portion having no electrodes.

11. The piezoelectric ceramic transformer as defined in claim 10 in which the width of notches in said internal electrode layers of the low impedance portion is within 10% of the diameter of the piezoelectric ceramic transformer.

12. The piezoelectric ceramic transformer as defined in claim 9 in which said transformer is a step-down type transformer.

13. The piezoelectric ceramic transformer as defined in claim 9 in which said transformer is a step-up type transformer.

14. The piezoelectric ceramic transformer as defined in claim 9 in which said transformer is used in a high frequency band not lower than 500 kHz.

15. The piezoelectric ceramic transformer as defined in claim 9 in which said transformer operates in a third radial extensional vibration mode.

16. The piezoelectric ceramic transformer as defined in claim 9 in which said internal electrode layers of the high impedance portion are composed of three Pt layers and said internal electrode layers of the low impedance portion are composed of five Pt layers.

* * * * *